US009509134B2

(12) United States Patent
Bermingham et al.

(10) Patent No.: US 9,509,134 B2
(45) Date of Patent: Nov. 29, 2016

(54) CENTRALIZED DC CURTAILMENT FOR OVERVOLTAGE PROTECTION

(71) Applicant: SMA Solar Technology AG, Niestetal (DE)

(72) Inventors: Matthew Bermingham, Westminster, CO (US); Michael Alexander, Denver, CO (US)

(73) Assignee: SMA SOLAR TECHNOLOGY AG, Niestetal (DE)

( * ) Notice: Subject to any disclaimer, the term of this patent is extended or adjusted under 35 U.S.C. 154(b) by 126 days.

(21) Appl. No.: 14/277,390

(22) Filed: May 14, 2014

(65) Prior Publication Data

US 2015/0333503 A1 Nov. 19, 2015

(51) Int. Cl.
*H02H 7/26* (2006.01)
*H02J 3/38* (2006.01)

(52) U.S. Cl.
CPC ............. *H02H 7/268* (2013.01); *H02J 3/383* (2013.01)

(58) Field of Classification Search
CPC .................................................. H02H 7/268
USPC ........................................................ 361/62
See application file for complete search history.

(56) References Cited

U.S. PATENT DOCUMENTS

| 6,262,558 | B1* | 7/2001 | Weinberg ............... B64G 1/428 136/291 |
| 2011/0203635 | A1 | 8/2011 | Beck |
| 2014/0077626 | A1* | 3/2014 | Levy ..................... B64G 1/428 307/126 |

FOREIGN PATENT DOCUMENTS

| DE | 102010007484 A1 | 8/2011 |
| FR | 2999029 A1 | 6/2014 |
| WO | 2012/147058 A1 | 11/2012 |

OTHER PUBLICATIONS

Machine translation of Emmert DE 102010007484 A1 published Aug. 11, 2011.*
International Search Report, PCT/EP2015/058160, dated Sep. 29, 2015.

* cited by examiner

*Primary Examiner* — Zeev V Kitov
*Assistant Examiner* — Kevin J Comber
(74) *Attorney, Agent, or Firm* — Eschweiler & Associates, LLC

(57) ABSTRACT

A disconnect unit and an associated method in a photovoltaic system includes a plurality of input power lines configured to receive power from a photovoltaic (PV) generator, and deliver the received power to an inverter. The disconnect unit further includes a sensor configured to determine a voltage at the plurality of input power lines, and a controller configured to selectively disconnect and reconnect one or more of the plurality of input power lines based on the determined voltage.

9 Claims, 5 Drawing Sheets

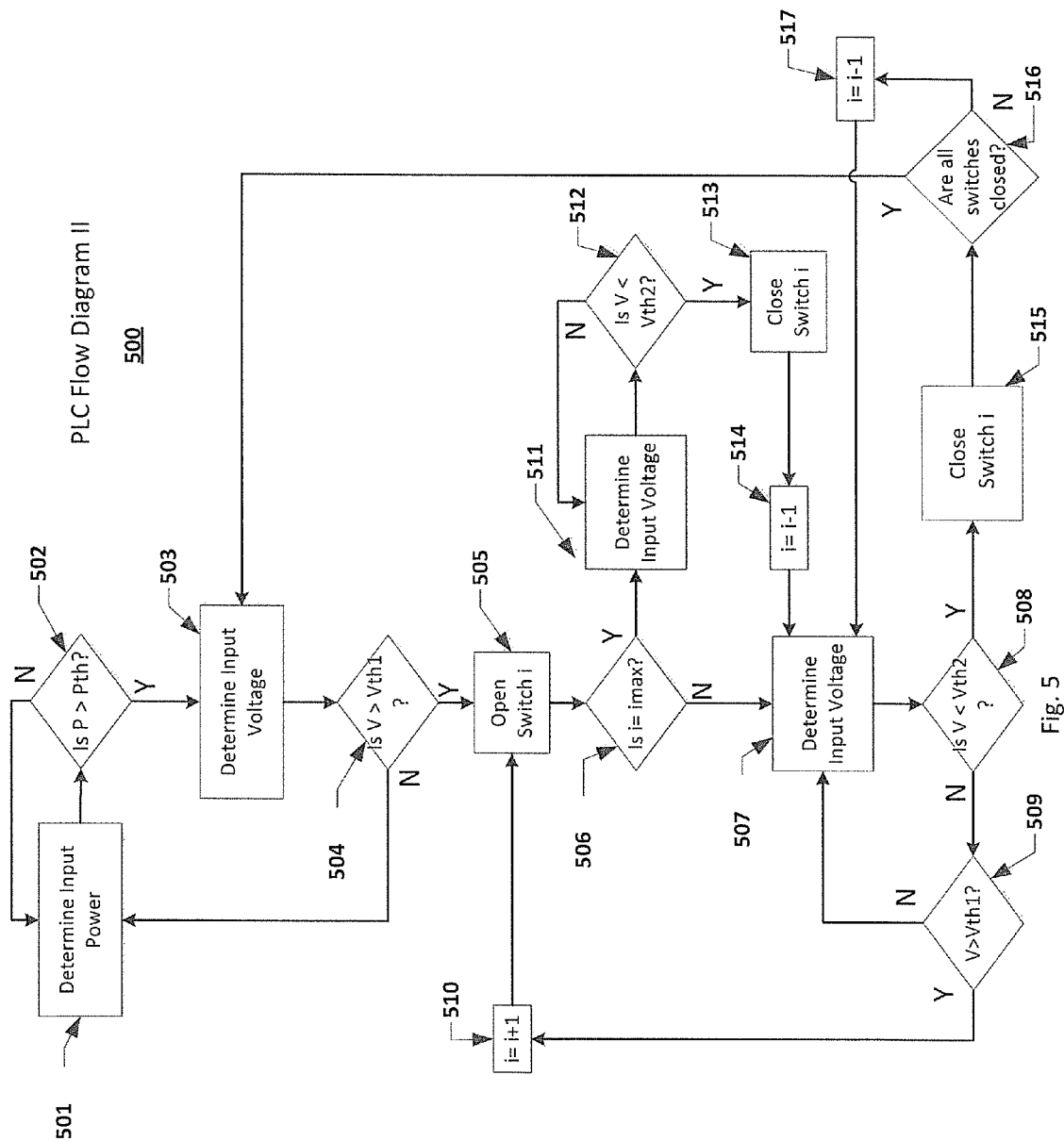

CENTRALIZED DC CURTAILMENT FOR OVERVOLTAGE PROTECTION

FIELD

The disclosure relates to a method for avoiding tripping of an inverter, as well as to a corresponding disconnect unit for controlling the input power to an inverter to avoid overvoltage.

BACKGROUND

An inverter converts DC power to AC power through switching to meet the requirements of the load connected thereto. The input to the inverter is usually a system generating DC power and the output AC power is delivered to consumers, generally through a power grid. In one example, the input of the inverter is connected to a green energy system, e.g., a photovoltaic generator which generates DC power through solar energy conversion via solar panels. Generally a large number of PV panels are connected together which generate a large amount of DC power, which are then fed to the inverter which then converts the DC power to AC power before feeding the AC power to the grid. In some instances the inverter may be unable to handle the large amount of DC power fed at its input which can lead to tripping of the inverters. When an inverter trips, the operation point of the PV panels has shifted from the MPP (Maximum Power Point) towards higher voltages. When exceeding a maximum rated DC input voltage of the inverter, the inverter disconnects from the PV panels for overvoltage protection. It is desired to avoid this disconnection of the inverters.

SUMMARY

In one embodiment of the disclosure, a disconnect unit in a photovoltaic system comprises a plurality of input power lines configured to receive power from a photovoltaic (PV) generator, and deliver the received power to an inverter. The disconnect unit further comprises a sensor configured to determine a voltage at the plurality of input power lines, and a controller coupled to the sensor configured to selectively disconnect and reconnect one or more of the plurality of input power lines based on the determined voltage.

In another embodiment of the disclosure, a disconnect unit is configured to control a voltage at an inverter by selectively disconnecting and reconnecting one or more DC input power lines between a PV generator and the inverter. The disconnecting of the DC input power lines is implemented by controlling the opening and closing of electrically controlled switches through monitoring of the power line voltage and comparing the voltage with a threshold voltage in a controller.

In another embodiment of the disclosure, a method for avoiding a tripping of an inverter due to high DC/AC ratio is disclosed. This method comprises a disconnect unit which houses a plurality of input power lines that receives power from a photovoltaic (PV) generator and is configured to couple with an inverter. There are electrically controlled switches on a select number of these input power lines, a monitoring system including a controller, and sensors to control the opening and closing of the switches. The method further comprises determining a voltage at input power lines from the PV generator using the sensors, and operating the electrically controlled switches in a manner that maintains the voltage within a nominal range by comparing the determined voltage with a threshold value within the controller.

BRIEF DESCRIPTION OF THE DRAWINGS

In the following, the disclosure will be further explained and described by means of specific example embodiments with reference to the enclosed drawings.

FIG. 5 shows a flow chart illustrating a further embodiment of the method of FIG. 4.

DETAILED DESCRIPTION

This disclosure is directed towards a method for avoiding a tripping of an inverter through DC power curtailment and an apparatus to achieve the DC power curtailment. The DC power curtailment is achieved through selectively disconnecting the input lines to the inverter, thereby reducing the total available power at the inverter's input. The power at the inverter's input is monitored, for example continuously or periodically, and this data is used to control switches on the input power lines in order to maintain the voltage within a nominal range.

Figure 1:
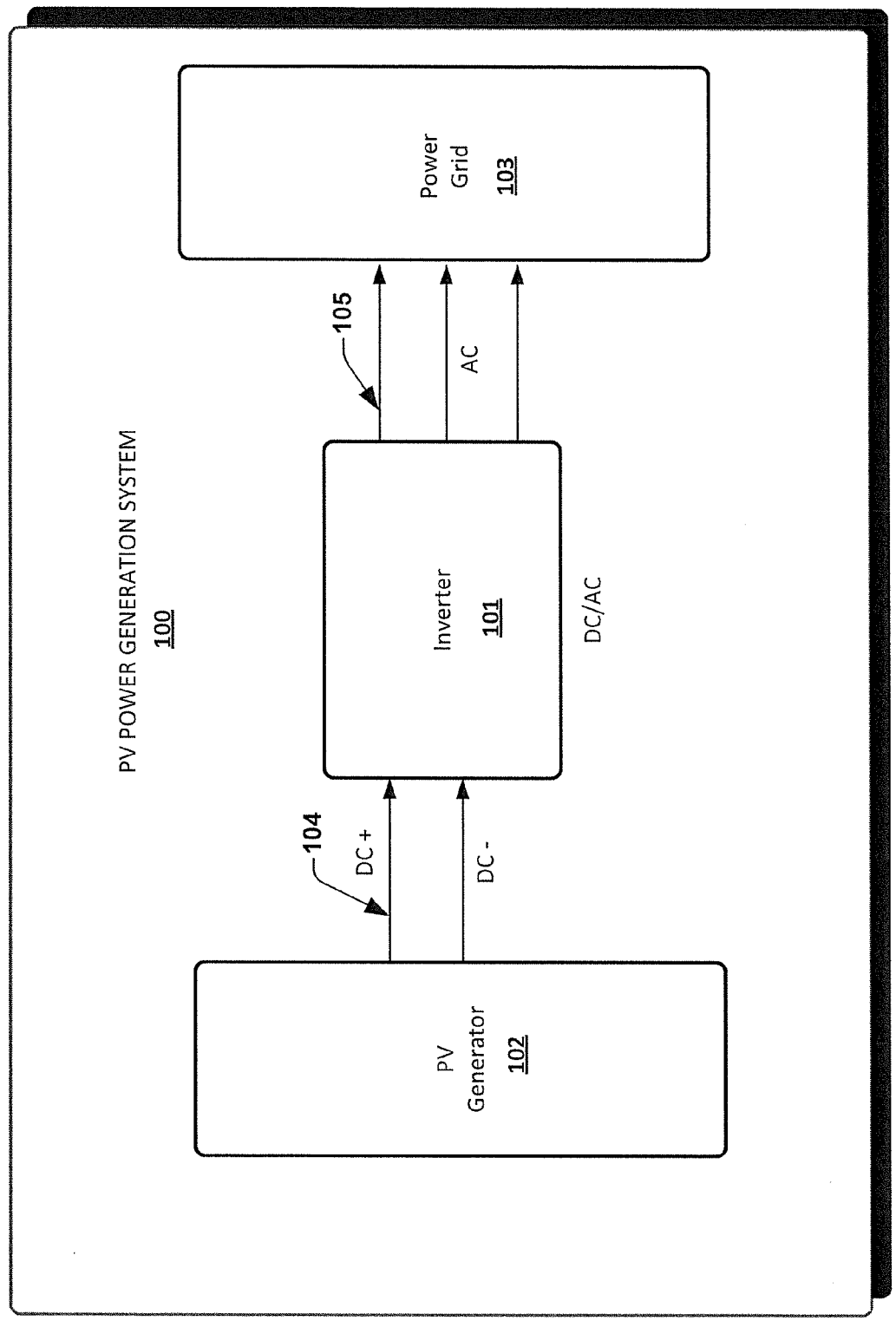
FIG. 1 shows a schematic diagram of a conventional photovoltaic power generation system with an inverter connecting a PV generator to a power grid.

FIG. 1 depicts a conventional photovoltaic power generation system 100 which includes an inverter 101, a PV generator 102 and a power grid 103. It also includes DC power lines 104 connecting the output of the PV generator 102 to the input of the inverter 101. It further includes AC power lines 105 feeding the power grid 103 from the inverter 101. Here, the inverter 101 is provided to convert the direct current (DC) coming from the PV generator 102 into alternating current (AC) to be fed to the power grid 103. The photovoltaic generator 102 is made up of a group of modules connected in series and with the module groups placed in parallel with each other. A group of series connected modules makes up what is known as a string. The total current of the PV generator is given by the sum of the current leaving each string and the overall voltage of the system is equivalent to the voltage generated by an individual string. So the total current from the PV generator is fed to the inverter 101 through a plurality of DC power lines from each of the PV strings. In one embodiment the inverter 101 is a three phase inverter which converts the DC power from the plurality of DC power lines 104 to three phase AC power to be fed to the grid 103.

Figure 2:
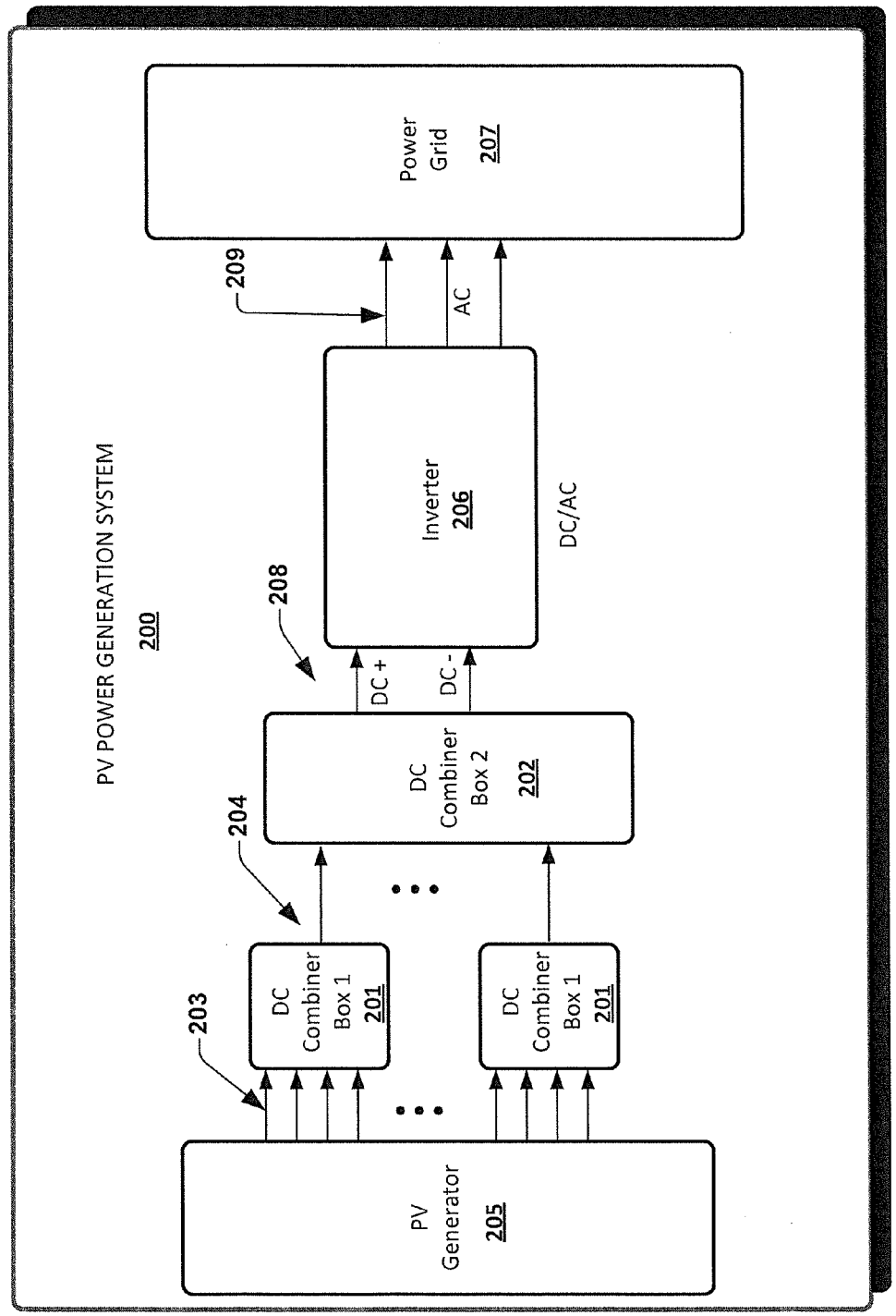
FIG. 2 shows a schematic diagram of a photovoltaic power generation system with DC combiner boxes connected between the PV generator and the inverter.

In photovoltaic power generation systems, a large number of DC power lines needs to be interfaced with the inverter. In some architectures multiple DC combiner boxes are connected between the PV generators and the inverters which combine a plurality of DC input power lines entering its input side to a reduced number of outputs to be interfaced with the inverter. FIG. 2 shows a particular embodiment wherein a PV power generation system 200 includes a first level of combiner boxes comprising multiple DC combiner boxes 201 and a second level of combiner boxes formed by a single DC combiner box 202 connected between the PV generator 205 and the inverter 206. The DC combiner boxes 201 and 202 provide isolation of the inverter DC terminals 208 from the PV array 205 through circuit breakers or fuses on the input power lines. Further, it combines the plurality of input PV power lines 203 and 204 into a fewer number of outputs 208 to be interfaced with the inverter 206. In this example, the DC combiner box 1 201 combines the multiple input power lines 203 from the PV generator 205 into a fewer number of outputs 204. These outputs 204 are then fed into DC combiner box 2 202 which further combines the outputs 204 into fewer outputs 208 which are then fed to the inverter 206.

Figure 3:
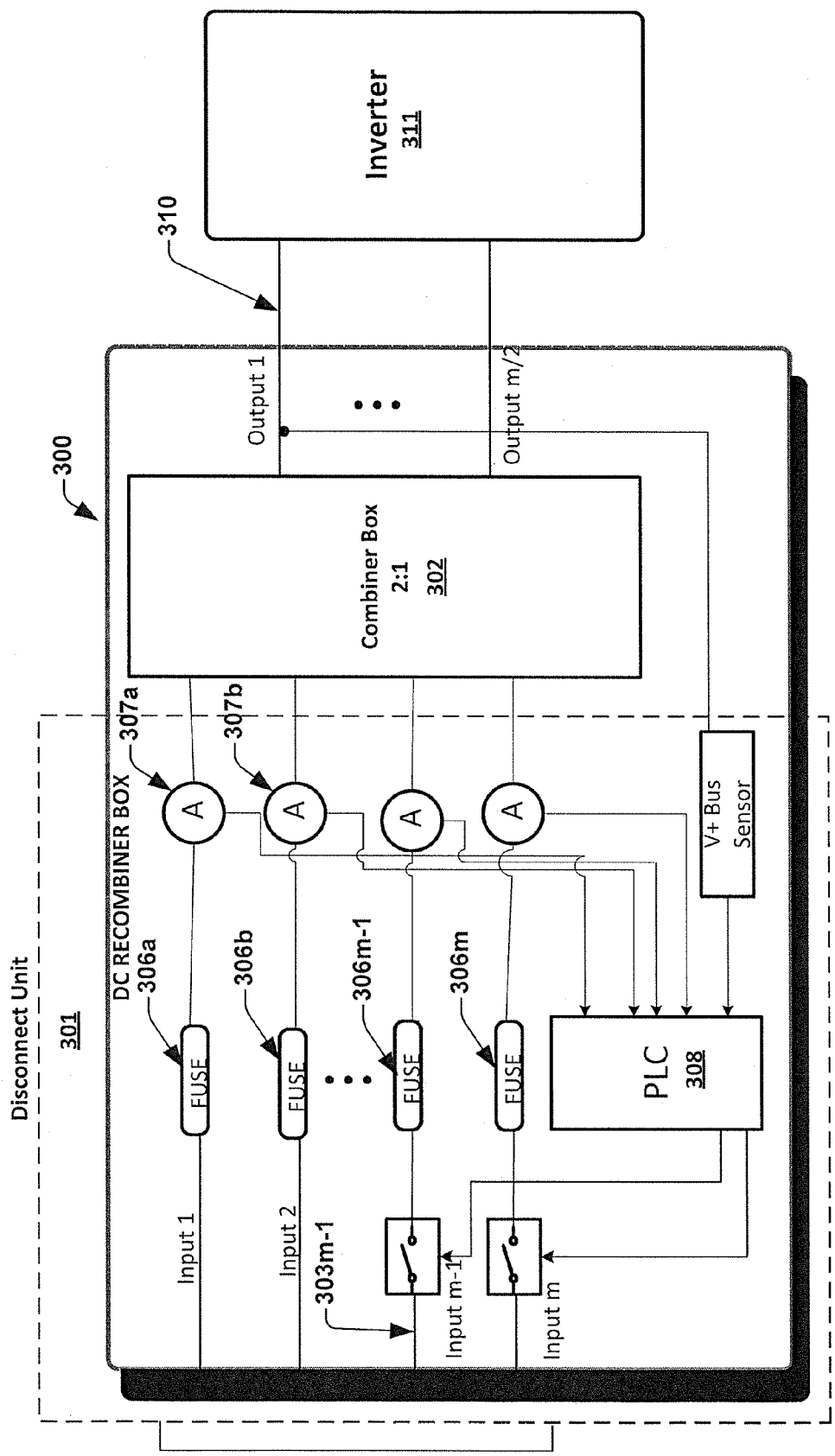
FIG. 3 shows a detailed schematic of the DC recombiner box with a disconnect unit for controlling the input power according to one embodiment of the disclosure.

Particularly, in this disclosure, there is a DC recombiner box between a PV generator and an inverter which includes a disconnect unit and a combiner box. However, it should be appreciated that in other embodiments the disconnect unit may be a stand-alone unit and not be part of a combiner box. FIG. 3 shows a detailed schematic of a DC recombiner box 300 connected between a PV generator (not shown) and an inverter 311. The DC recombiner box 300 includes a disconnect unit 301 which is used to control the amount of input power reaching the inverter 311 input and a combiner box 302 which combines the input power lines 303 into outputs 310 to be interfaced with the inverter 311. At least one of the DC combiner boxes 201, 202 are configured as a DC recombiner box 300, in particular all DC combiner boxes 201, 202 of a level of combiner boxes or all DC combiner boxes may be configured as a DC recombiner box 300.

In one embodiment a dedicated DC recombiner box is provided for each inverter. In a particular embodiment, the PV generator is coupled to the inverters via a 1000 VDC collector system. This 1000 VDC collector system will terminate in the disconnect unit, for example, via 18 main feeders per inverter.

The disconnect unit 301 in FIG. 3 includes a plurality of input lines 303 from the PV generator. Each of the input power lines 303 comprises a fuse 306 or circuit breaker to provide electrical isolation for each of the incoming power lines. Further, each input power line 303 comprises a current measuring instrument which can be an ammeter 307 or a current transducer to measure the current flowing through each line.

The disconnect unit 301 controls the power line voltage by selectively connecting or disconnecting one or more of the input power lines 303 via electrically controlled switches 304 and 305 to effectively lower the input voltage. In this context, electrically controlled switches 304 and 305 are provided on a select number of input lines 303 from the PV generator to the DC recombiner box. FIG. 3 shows switches 304 and 305 on the input lines 303$m$-1 and 303$m$, along with a voltage bus sensor 309 for measurement of the voltage at the inverter's input, current meters 307 on each input line 303, and a controller 308. In one particular embodiment, the controller 308 used is a programmable logic controller (PLC), but any controller or control circuitry may be employed and all such variations are contemplated as falling within the scope of the disclosure. Such a controller may be implemented solely in hardware or in software, or in a combination of hardware and software. The measured current values of each input line 303 and the sensed voltage at the inverter's input 310 are fed to the controller 308 which then calculates the incoming power based on the inputs. The controller 308 then uses this data, along with the bus voltage to determine if the incoming power is too high for the inverter maximum power point tracking (MPPT) algorithm to work properly. In one embodiment, once the incoming power is detected to be above a threshold value, and the power line voltage is determined subsequently or concurrently to be above an upper threshold value, the controller 308 will begin disconnecting the input power lines by opening incrementally the switches 304 and 305 to reduce the voltage to a nominal range. Further, when the power line voltage goes below a lower threshold value, the controller 308 will begin closing incrementally the switches 304 and 305 as necessary to return the voltage to the nominal voltage range. In one embodiment an upper and a lower threshold value for voltage is provided as hysteresis to define a safe operating region for the switch in order to avoid continuous switching, which further reduces the damage on the switches.

In one embodiment, the electrically controlled switches are provided on 5 out of 18 input lines from the PV generator. However, in general, the electrically controlled switches can be provided on m out of n input lines where m<=n. Also, in one embodiment the switches 304 and 305 are opened and closed in steps of one at a time based on the calculated incoming power.

The combiner unit 302 is configured to receive a plurality of input lines 303 from the disconnect unit 301 and output a reduced number of input power lines 310 to be interfaced with the inverter 311. In one particular embodiment, the combiner unit used is a 2:1 combiner 302 which combines each pair of two input DC power lines 303 at 200 A to one 400 A output 310 for a total of 18 inputs to 9 outputs to be interfaced with the inverter 311.

In other embodiments, additional security features are included in the DC recombiner box 300 apart from the disconnect unit 301 and the combiner unit 302. Additional remote control features are included to monitor and control the electrically controlled switches 304 and 305. Also, in further embodiments alarms are included to indicate a switch failure or for the case when the DC/AC ratio is still too high with all the switches 304 and 305 open, wherein the plant operator will be notified.

In one embodiment the controller 308 keeps track of which switch was previously opened/closed in providing the requisite control in order to prevent the same switch from always being the first switch to open or close. In this manner, one of the switches does not experience inordinate switching wear compared to the other switches. In one embodiment, the five switches are opened in the order, 1, 2, 3, 4, and 5. If switch #1 opens and no further switches need to be opened to maintain the power line voltage in the nominal range, after switch #1 is subsequently closed, the next time the controller 308 detects a condition that requires a switch to be opened, the controller 308 first opens switch #2, for example, and so on. Other control schemes may also be used, and all such alternatives are contemplated as falling within the scope of the present disclosure. For example, the controller 308 may use a random number generator to select the first switch to be opened in a predetermined order.

Figure 4:
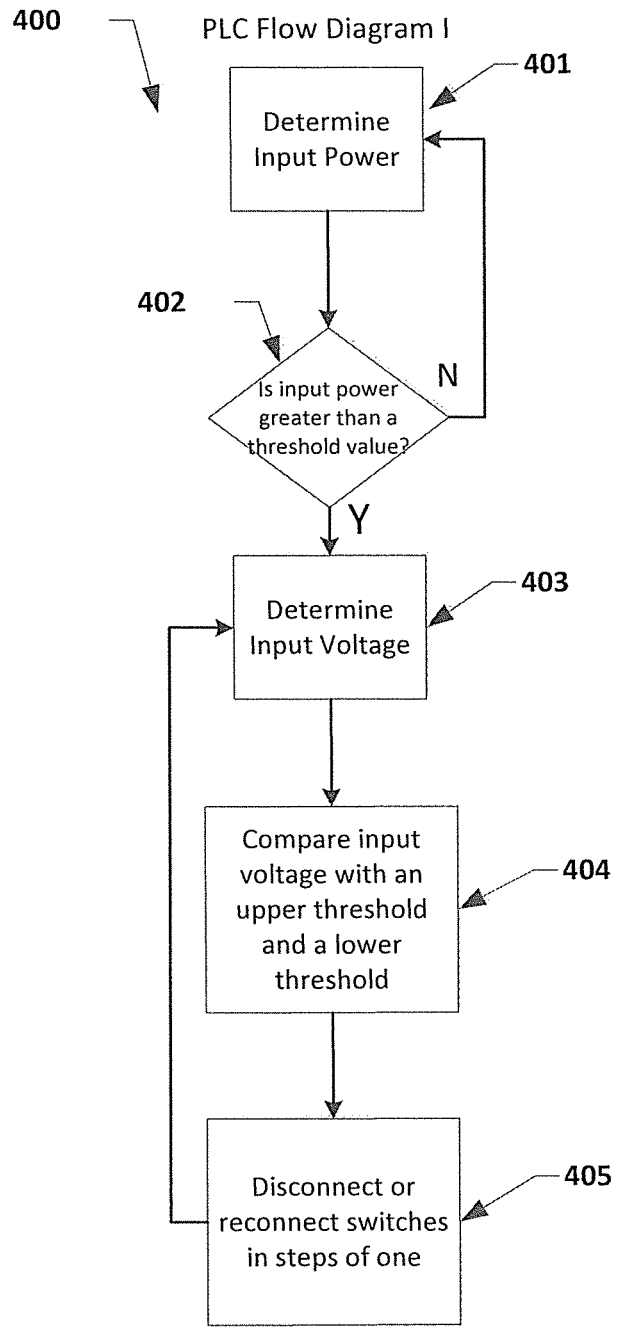
FIG. 4 shows a flow chart illustrating a method for controlling the input power to an inverter, which may also constitute a process flow for a controller within a disconnect unit according to one embodiment of the disclosure.

FIG. 4 illustrates an example method 400 for controlling the power line voltage to an inverter by selectively disconnecting or connecting the input power lines based on a threshold. In one implementation, the example method can be implemented in the PLC 308 of the DC recombiner box 300. The example method 400 is described with reference to FIG. 3, however, any circuitry may be employed to carry out the method. At block 401, the input power from the PV generator to the inverter 311 is determined. At block 402, the input power is compared with a threshold value. If the input power is greater than the threshold value (YES at 402), the method proceeds to block 403, otherwise (NO at 402) the method proceeds to block 401. At block 403, the input voltage is determined. At block 404, the determined input voltage is compared with an upper threshold value and a lower threshold value. At block 405, the electrically controlled switches 304 and 305 are selectively opened or closed based on the value of the determined voltage in steps of one, for example. If the voltage is detected to be above the upper threshold value at 404, then the switches 304 and 305 are opened incrementally to lower the voltage, and if the voltage is detected to be below the lower threshold value at 404, then the switches 304 and 305 are closed incrementally to increase the voltage. Once a switch is opened or closed, the control goes back to block 403 where the voltage is determined again. Thus in one embodiment there is continuous or periodic monitoring of the voltage in order to maintain the voltage within the nominal range (i.e., between the lower and upper thresholds).

FIG. 5 gives a detailed illustration according to one embodiment of the method explained in FIG. 4. At block 501, the input power from the PV generator to the inverter (e.g., inverter 311) is determined. At block 502, the input power is compared with a threshold value Pth. If the input power is detected to be greater than the threshold value Pth (YES at 502), then the method 500 proceeds to block 503. Otherwise (NO at 502), the method 500 returns to 501 and the input power is determined again. At block 503, the voltage at the inverter input terminals is determined. At block 504, the determined input voltage is compared with an upper threshold value Vth1. If the input voltage is determined to be greater than the upper threshold value Vth1 (YES at 504), then the method proceeds to block 505. Otherwise (NO at 504), the method returns to 501 and the input power is determined again. At block 505 a determination has been made that the voltage exceeds the upper threshold Vth1, and one of the switches of the disconnect unit, say switch i (e.g., switch 304) is opened, where i indicates the number of the switch. At block 506, the switch number is verified to check if all the switches are open. If all the switches are not open (NO at 506), the method 500 proceeds to block 507, where the voltage is determined again. At block 508, the voltage is compared with a lower threshold value Vth2. If the detected voltage is greater than the lower threshold value Vth2 (NO at 508), then the method proceeds to block 509. At block 509, the voltage is compared again with the upper threshold value Vth1. If the detected voltage is still greater than the upper threshold value Vth1 (YES at 509), then the method continues to block 510. Otherwise if the detected voltage is lower than the upper threshold value Vth1 (NO at 509), then at this point, no further opening or closing of switches is required and the method proceeds to block 507, where the input voltage is determined again. At block 510, where a determination has been made that the voltage is still too high despite the opening of a switch, the switch number is incremented to i+1 (e.g., switch 305) and another switch i+1 (e.g., switch 305) is opened at block 505. Note that in the method 400 of FIG. 4, the input voltage determinations, comparisons and corrective actions of acts 403-405 proceed only if an initial determination is made that the input power is too high at 401-402. In an alternative embodiment, the initial power determination is skipped and the method 400 proceeds at 403-405 regardless of the input power.

Still referring to FIG. 5, at block 506, the switch number is verified again to check if all the switches are open. Once all the switches are open (e.g., switch 304 and 305) (YES at 506), the method continues to block 511, where the voltage is determined again. At block 512, the voltage is compared with the lower threshold value Vth2. If the detected voltage is lower than the lower threshold value Vth2 (YES at 512), then the method continues to block 513. Otherwise, the voltage is determined again at 511. At block 513, and switch i is closed (e.g., switch 305), since the current value of i points to switch 305. At block 514, the switch number is decremented to i-1, so the current value of i points to switch 304. Now the method proceeds to block 507, where the voltage is determined again. At block 508, the voltage is compared with the lower threshold value Vth2. If the detected voltage is lower than the lower threshold value Vth2 (YES at 508), then the method continues at block 515, where the switch i is closed (e.g., switch 304). At block 516, the switch number is verified again to check if all the switches (e.g., switch 304 and 305) are closed. If all the switches are not closed (NO at 516), the switch number i is decremented at block 517 and then the voltage is determined again at the block 507. In this example, since both the switches (e.g., switch 304 and 305) are closed (YES at 516), the input power is determined again at block 501.

Again, like in FIG. 4, the method 500 of FIG. 5 contains an optional initial determination of input power, followed by voltage monitoring if the input power exceeds a power threshold (i.e., YES at 502). Alternatively, the method 500 may proceed without any initial power determination at 501.

The method described above is just one of the many ways of implementing the PLC algorithm and the order in which the method is described is not intended to be construed as a limitation. Any number of described method blocks can be combined in any order to implement the method and additionally, individual blocks may be deleted from the method without departing from the spirit and scope of the subject matter described herein.

In one particular implementation, the switches are opened and closed in a way that the same switches are not being used all the time. For example, every time the voltage is detected to be above the upper threshold value, the control goes to the next unused switch, so as to reduce the damage on the switches.

In one embodiment, a disconnect unit in a photovoltaic system comprises a plurality of input power lines configured to receive power from a photovoltaic (PV) generator, and deliver the received power to an inverter. The disconnect unit further comprises a sensor configured to determine a voltage associated with the plurality of input power lines, and a controller configured to selectively disconnect and reconnect one or more of the plurality of input power lines based on the calculated output power and voltage.

In one embodiment, the disconnect unit further comprises a combiner unit configured to receive the plurality of input power lines and output a reduced number of input power lines to be interfaced with the inverter. In another embodiment, the disconnect unit further comprises an electrically controlled switch on m out of n input power lines, wherein m and n are integers, and n represents a total number of input power lines, and wherein m<=n.

In one embodiment of the disconnect unit, disconnecting and reconnecting one of the input power lines is achieved through opening and closing the electrically controlled switch associated with the one input power line. In another embodiment of the disconnect unit, opening and closing of the electrically controlled switches is controlled by the controller based on the calculated output power and voltage.

In one embodiment, the sensor comprises a current sensor on each of the input power lines in order to determine a total input current from the PV generator. In another embodiment, the sensor comprises a voltage sensor configured to sense a voltage at the inverter's input. In still another embodiment of the disconnect unit, the controller is configured to receive the total input current and the voltage from the voltage sensor and calculate the total output power in order to control the opening and closing of the switches.

In one embodiment, a disconnect unit is configured to control an input power delivered to an inverter by selectively disconnecting and reconnecting one or more DC input power lines between a PV generator and the inverter. The disconnecting of the DC input power lines is implemented by controlling the opening and closing of electrically controlled switches through monitoring of a voltage and comparing with a threshold voltage in a controller.

In one embodiment, the controller has an upper threshold value of voltage. In another embodiment, the controller has a lower threshold value of voltage. In still another embodiment, the controller constantly or periodically compares the voltage with an upper threshold value and a lower, different threshold value.

In one embodiment of the disconnect unit, the controller begins opening the switches when the voltage is above the upper threshold value and begins closing the switches when the voltage is below the lower threshold value. In another embodiment, the switches are opened and closed incrementally based on the determined voltage.

In one embodiment, a method for avoiding a tripping of a inverter due to overvoltage is provided, and comprises providing a disconnect unit configured to couple to the inverter comprising a plurality of input power lines configured to receive power from a photovoltaic (PV) generator and electrically controlled switches on a select number of input power lines, a monitoring system including a controller, and a sensor to control the opening and closing of the switches. The method further comprises determining a voltage from the PV generator using the sensor, and operating the electrically controlled switches in a manner that maintains the voltage within a nominal range by comparing the determined voltage with a threshold value within the controller.

In one embodiment of the method, the disconnect unit further comprises a combiner unit configured to receive the plurality of input power lines and output a reduced number of input power lines to be interfaced with the inverter.

In one embodiment of the method, the calculated values of voltage are compared against an upper threshold value and a lower, different threshold value. In another embodiment of the method, operating the electrically controlled switches comprises opening the switches incrementally when the determined value of voltage is above the upper threshold value and closing the switches incrementally when the determined value of voltage is below the lower threshold value.

In one embodiment of the method, the voltage of the PV generator is monitored on a continuous or periodic basis to avoid inverter tripping. In another embodiment, the opening and closing of the switches is fully automatic and independent of the inverter control/operation.

The invention claimed is:

1. A disconnect unit in a photovoltaic system comprising:
a plurality of input power lines configured to receive power from a photovoltaic (PV) generator, and deliver the received power to an inverter;
a combiner unit configured to receive the plurality of input power lines and output a reduced number of input power lines to be interfaced with the inverter;
a voltage sensor configured to determine the voltage associated with the input power lines;
an electronically controlled switch on m of n input power lines upstream of the combiner unit, wherein m and n are integers, and n represents a total number of the plurality of input power lines input to the combiner unit, and wherein m<=n, wherein disconnecting and reconnecting an input power line is achieved through an opening and closing of the electronically controlled switch associated with the respective input power line; and
a controller unit configured to:
receive a voltage associated with the input power lines; and
if the voltage is greater than an upper voltage threshold, then the controller unit is configured to activate one or more of the electronically controlled switches, dictated by previous switching history, to thereby disconnect the respective one or more input power lines associated therein.

2. The disconnect unit of claim 1, wherein the controller is configured to open one electronically controlled switch at a time, therefore disconnecting the associated input power line to the combiner unit.

3. The disconnect unit of claim 1, wherein the controller is configured to close one electronically controlled switch at a time, therefore reconnecting the associated input power line to the combiner unit.

4. The disconnect unit of claim 1, wherein the controller is configured to open multiple electronically controlled switches at a time, therefore disconnecting the associated input power lines to the combiner unit.

5. The disconnect unit of claim 1, wherein the controller is configured to close multiple electronically controlled switches at a time, therefore reconnecting the associated input power lines to the combiner unit.

6. The disconnect unit of claim 1, wherein the controller unit is further configured to continuously or periodically compare the voltage of the input power lines with the predetermined upper voltage threshold to thereby disconnect one or multiple input power lines to the combiner unit.

7. The disconnect unit of claim 1, wherein the controller unit is further configured to continuously or periodically compare the voltage of the input power lines with a predetermined lower voltage threshold to thereby reconnect one or multiple input power lines to the combiner unit.

8. A disconnect unit in a photovoltaic system comprising:
a plurality of input power lines configured to receive power from a photovoltaic (PV) generator, and deliver the received power to an inverter;
a combiner unit configured to receive the plurality of input power lines and output a reduced number of input power lines to be interfaced with the inverter;
a voltage sensor configured to determine the voltage associated with the input power lines;
an electronically controlled switch on m of n input power lines upstream of the combiner unit, wherein m and n are integers, and n represents a total number of the plurality of input power lines input to the combiner unit, and wherein m<=n, wherein disconnecting and reconnecting an input power line is achieved through an opening and closing of the electronically controlled switch associated with the respective input power line; and
a controller unit configured to:
receive a voltage associated with the input power lines;

if the voltage is greater than an upper voltage threshold, then the controller unit is configured to activate one or more of the electronically controlled switches to thereby disconnect the respective one or more input power lines associated therein; and reconnect one or more input power lines by activating a particular electronically controlled switch, dictated by previous switching history, when the voltage is below a predetermined lower threshold voltage.

9. A disconnect unit in a photovoltaic system comprising:
a plurality of input power lines configured to receive power from a photovoltaic (PV) generator, and deliver the received power to an inverter;
a combiner unit configured to receive the plurality of input power lines and output a reduced number of input power lines to be interfaced with the inverter;
a voltage sensor configured to determine the voltage associated with the input power lines;
an electronically controlled switch on m of n input power lines upstream of the combiner unit, wherein m and n are integers, and n represents a total number of the plurality of input power lines input to the combiner unit, and wherein m<=n, wherein disconnecting and reconnecting an input power line is achieved through an opening and closing of the electronically controlled switch associated with the respective input power line; and
a controller unit configured to:
  receive a voltage associated with the input power lines; and
  if the voltage is greater than an upper voltage threshold, then the controller unit is configured to activate one or more of the electronically controlled switches to thereby disconnect the respective one or more input power lines associated therein;
  utilize a current sensor on each of the input power lines to determine the current associated with the respective input power line from the PV generator;
  receive the current associated with the input power lines;
  utilize the received current and voltage to calculate a power therefrom;
  compare the calculated power to a predetermined power threshold;
  if the calculated power is greater than the predetermined power threshold, then the controller unit is configured to compare the voltages with the predetermined upper voltage threshold;
  if the voltage is greater than the upper voltage threshold, then the controller unit is configured to activate one or more of the electronically controlled switches to thereby disconnect the respective one or more input power lines associated therein; and
  if the voltage is less than a lower voltage threshold, then the controller unit is configured to activate one or more of the electronically controlled switches to thereby connect the respective one or more input power lines associated therein.

* * * * *